(12) United States Patent
Troia et al.

(10) Patent No.: US 11,875,860 B2
(45) Date of Patent: *Jan. 16, 2024

(54) INTELLIGENT CHARGE PUMP ARCHITECTURE FOR FLASH ARRAY

(71) Applicant: Lodestar Licensing Group LLC, Evanston, IL (US)

(72) Inventors: Alberto Troia, Munich (DE); Antonino Mondello, Messina (IT)

(*) Notice: Subject to any disclaimer, the term of this patent is extended or adjusted under 35 U.S.C. 154(b) by 0 days.

This patent is subject to a terminal disclaimer.

(21) Appl. No.: 17/870,714

(22) Filed: Jul. 21, 2022

(65) Prior Publication Data

US 2022/0359019 A1  Nov. 10, 2022

Related U.S. Application Data

(63) Continuation of application No. 16/624,879, filed as application No. PCT/IB2019/000487 on May 31, 2019, now Pat. No. 11,398,282.

(51) Int. Cl.
| | |
|---|---|
| *G11C 16/30* | (2006.01) |
| *G01R 31/3177* | (2006.01) |
| *G11C 16/14* | (2006.01) |
| *G11C 16/26* | (2006.01) |
| *H02M 3/07* | (2006.01) |

(52) U.S. Cl.
CPC .......... *G11C 16/30* (2013.01); *G01R 31/3177* (2013.01); *G11C 16/14* (2013.01); *G11C 16/26* (2013.01); *H02M 3/073* (2013.01); *H02M 3/071* (2021.05)

(58) Field of Classification Search
CPC ......... G11C 16/30; G11C 16/14; G11C 16/26; G11C 16/12; G11C 5/145; G01R 31/3177; H02M 3/073; H02M 3/071

USPC .................................................... 365/185.18
See application file for complete search history.

(56) References Cited

U.S. PATENT DOCUMENTS

| | | | |
|---|---|---|---|
| 9,432,298 B1 | 8/2016 | Smith | |
| 9,722,489 B1 | 8/2017 | Guo | |
| 11,398,282 B2* | 7/2022 | Troia | G11C 16/14 |
| 2002/0104031 A1 | 8/2002 | Tomlinson | |
| 2004/0003167 A1 | 1/2004 | Kimura et al. | |
| 2010/0072816 A1 | 3/2010 | Kenkare | |

(Continued)

OTHER PUBLICATIONS

International Search Report and Written Opinion from related international application No. PCT/IB2019/000487, dated Feb. 18, 2020, 20 pages.

*Primary Examiner* — Hoai V Ho
(74) *Attorney, Agent, or Firm* — Brooks, Cameron & Huebsch, PLLC

(57) ABSTRACT

The present disclosure relates to a non-volatile memory device and to a method for generating overvoltage values in such a memory device structured in a plurality of sub-arrays and including at least a decoding and sensing circuitry associated with each sub-array, a charge pump architecture for each sub-array including pump stages for increasing the value of an input voltage and obtaining an overvoltage output value, a control and JTAG interface in the memory device, and at least a registers block coupled to the charge pump architecture and driven by a logic circuit portion for receiving at least an activation signal selecting a specific charge pump architecture associated with a memory sub-array of the plurality of sub-arrays.

20 Claims, 10 Drawing Sheets

(56) References Cited

U.S. PATENT DOCUMENTS

2011/0115549 A1  5/2011  Cook
2012/0020161 A1  1/2012  Haukness

* cited by examiner

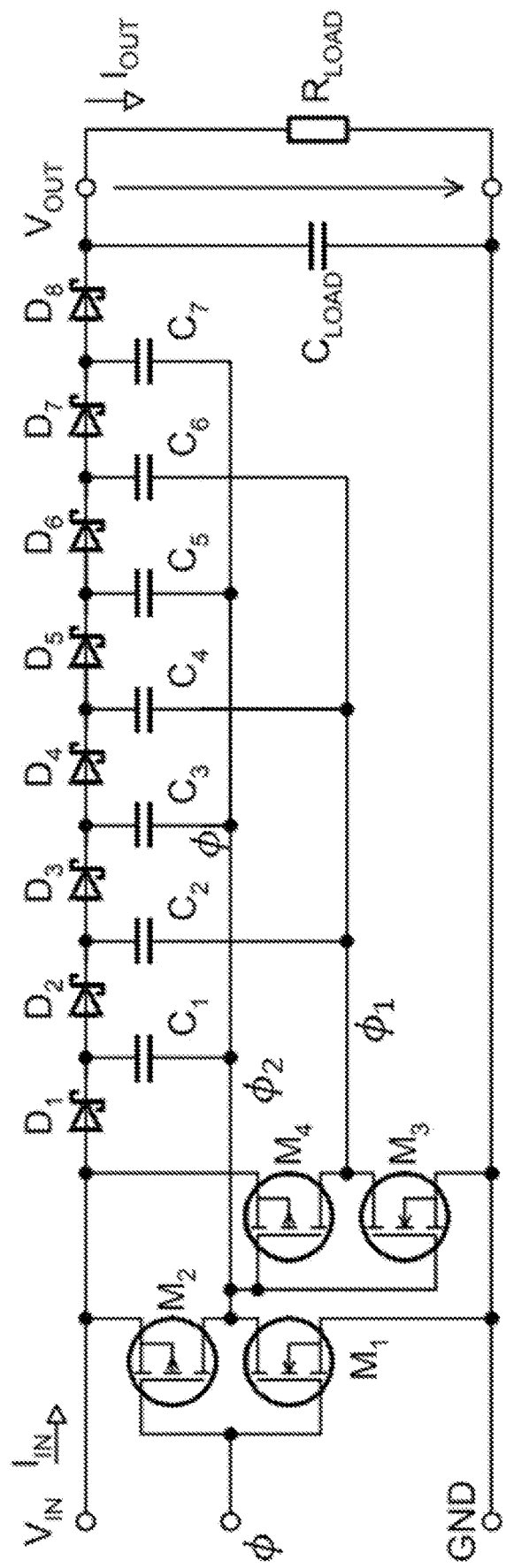
FIG. 1A – PRIOR ART

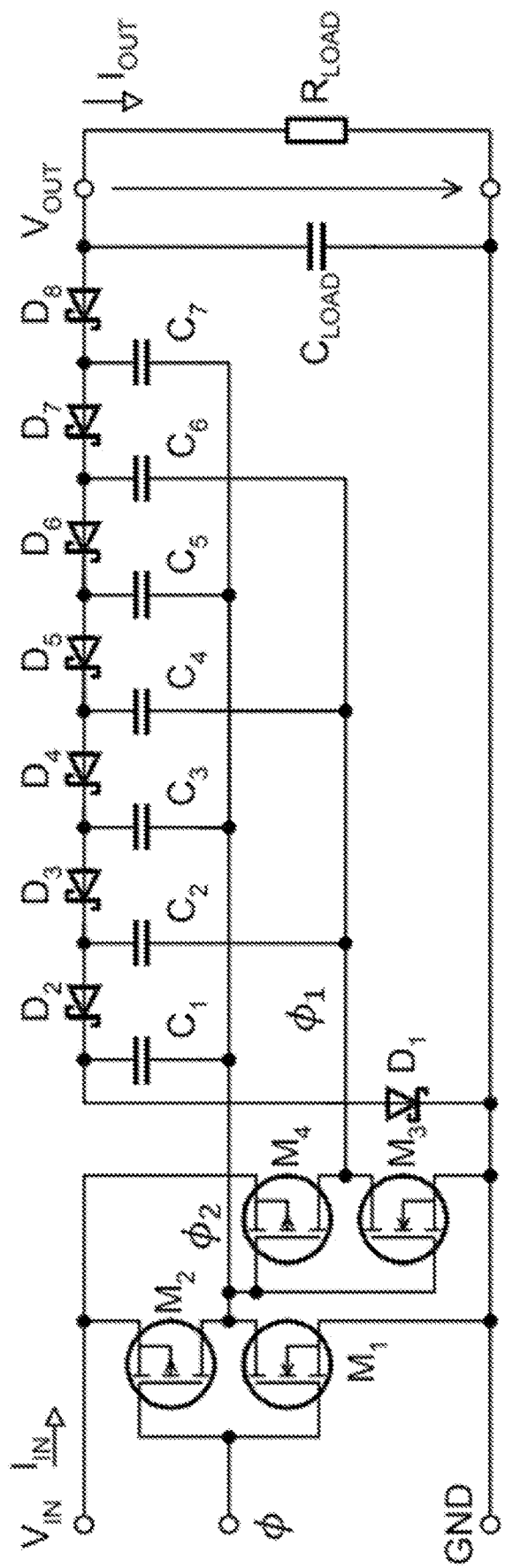
FIG. 1B – PRIOR ART

INTELLIGENT CHARGE PUMP ARCHITECTURE FOR FLASH ARRAY

PRIORITY INFORMATION

This application is a Continuation of U.S. application Ser. No. 16/624,879, filed on Dec. 19, 2019, which is a National Stage Application under 35 U.S.C § 371 of International Application Number PCT/IB2019/000487, filed May 31, 2019, the entire contents of which are incorporated herein by reference.

TECHNICAL FIELD

The present invention relates to semiconductor non-volatile memory devices and in particular to a new flash memory array component including an intelligent charge pump architecture for flash memory portion associated to SoC devices.

BACKGROUND

A flash memory is a type of non-volatile memory that retains stored data without a periodic refresh of electricity. An important feature of a flash memory is that it can be erased in blocks instead of one byte at a time. Each erasable block of memory comprises a plurality of non-volatile memory cells arranged in a matrix of rows and columns. Each cell is coupled to a word line, bit line and source line. The cells are programmed and erased by manipulating the voltages on the word lines, bit lines and source lines.

A Flash Memory device is usually supplied with low voltage power sources, for instance 1.8V and/or 3.3V. This low voltage however is not enough to perform all the operations in the array.

Flash Memory are usually equipped with charge pumps for increasing the voltage levels provided by reference voltage generators; those increased voltage levels are used on memory cells during write and erase operations.

A charge pump is an external controlled device where the output is compared with a certain reference value, except for a ratio that allow to match the comparison values, for instance like the known Dickson charge pump with diodes and MOSFETs for driving capacitors. FIG. 1A shows a schematic view of Dickinson positive charge pump while FIG. 1B shows a schematic view of Dickinson negative charge pump.

The operating mechanism is made using a non-overlapping two phases clock. The purpose is to store charge in a capacitance, using one phase, and transfer that charge to another capacitance, using another phase. A proper modulation of the phases allows the charge pump to store the charge in a capacitance and transfer it to the other one, increasing the equivalent value Vs a reference.

In a first stage a capacitor is connected across the supply, charging it to that same voltage. In a second stage the circuit is reconfigured so that the capacitor is in series with the supply and the load. This doubles the voltage across the load as the sum of the original supply and the capacitor voltages. The pulsing nature of the higher voltage switched output is often smoothed by the use of an output capacitor. The number of stages influences the final output voltage of the circuit.

The architecture of a charge pump is of greater importance in all memory portions embedded or associated in System on Chips wherein the reliability and of the architecture and the possibility of using the charge pump for obtaining a variety of internal voltage values is crucial.

BRIEF DESCRIPTION OF THE DRAWINGS

FIG. 1A shows a schematic view of a positive charge pump of known structures used in semiconductor memory devices;

FIG. 1B shows a schematic view of a negative charge pump of known structures used in semiconductor memory devices;

DETAILED DESCRIPTION

Non-volatile Flash memories are today one of the fundamental building blocks in modern electronic systems particularly for Real Time Operating Systems (RTOS). The operation of non-volatile Flash memories is managed by a controller including an embedded firmware, such controller performing the required write/read/erase operations.

Non-volatile memory can provide persistent data by retaining stored data when not powered and can include NAND flash memory, NOR flash memory, Read Only Memory (ROM), Electrically Erasable Programmable ROM (EEPROM), Erasable Programmable ROM (EPROM), and resistance variable memory such as phase change random access memory (PCRAM), self-selecting chalcogenide-based memories, resistive random access memory (RRAM), 3D XPoint memory (3DXP) and magnetoresistive random access memory (MRAM), among others.

More particularly, a flash memory is a type of non-volatile memory that retains stored data and is characterized by a very fast access time. Moreover, it can be erased in blocks instead of one byte at a time. Each erasable block of memory comprises a plurality of non-volatile memory cells arranged in a matrix of rows and columns. Each cell is coupled to an access line and/or a data line.

The cells are programmed and erased by manipulating the voltages on the access and data lines; to do so the memory component need voltage values that are boosted if compared to the supply voltages and for this reason the memory structure includes one or more positive charge pumps, for the reading and programming phases of the memory cells, as well as negative charge pumps for the erasing phase of the memory cells.

Figure 2:
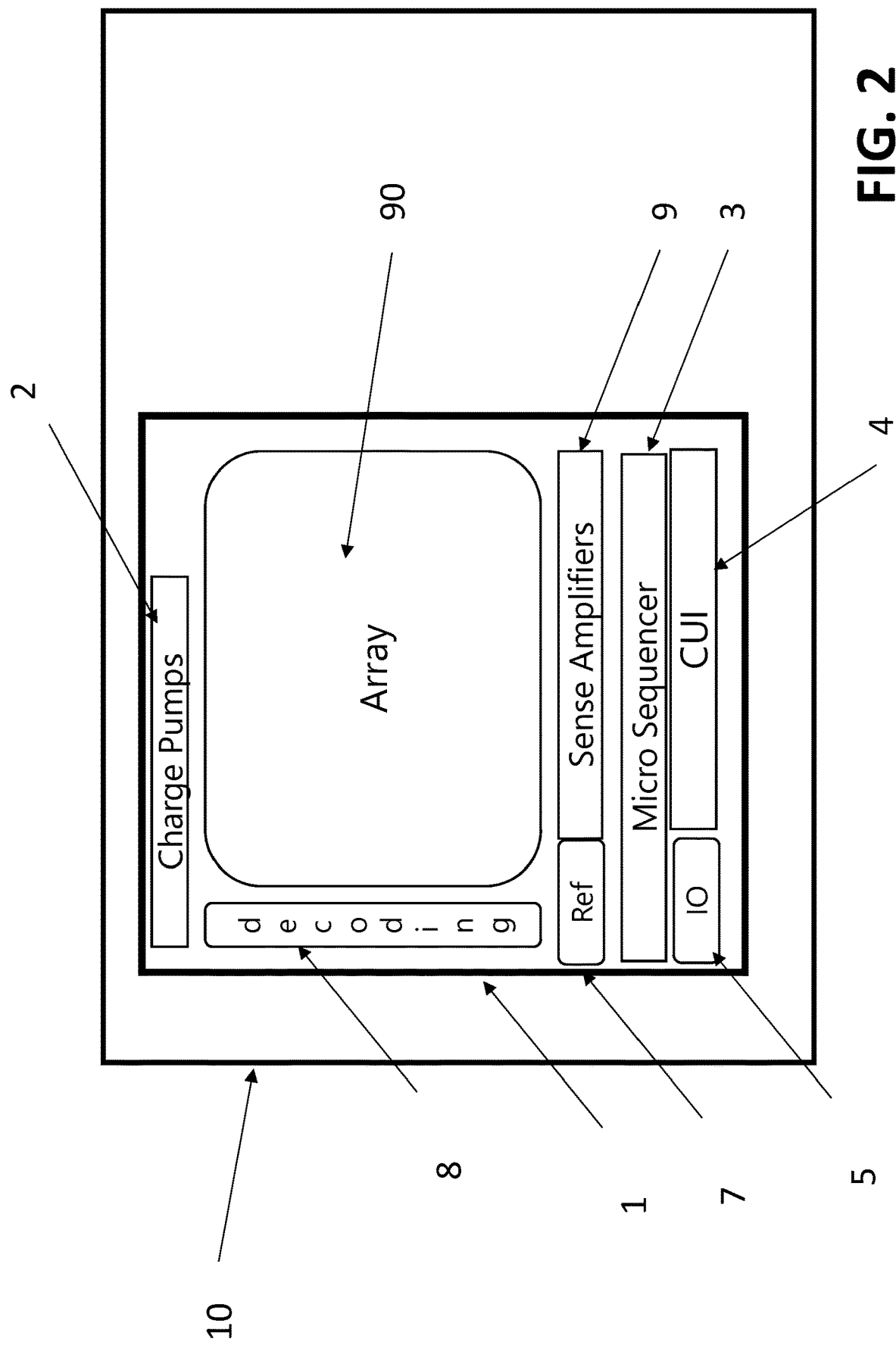
FIG. 2 shows a schematic view of a host device, for instance a System-on-Chip, coupled to a non-volatile memory component according to embodiments of the present disclosure.

With reference to those enclosed figures, and in particular to the example of FIG. 2, apparatuses and methods involving a non-volatile memory device 1 or component and a host device 10 for such a memory device will be disclosed herein.

The host device 10 can be a System-on-Chip with an embedded memory component 1 or a more complex electronic device including a system coupled to a memory device, as will appear from the description of other embodiments of the present disclosure made with reference to other figures.

Currently, the technology of the complex semiconductor structures known as System-on-Chips (SoC) provides the integration of at least an embedded non-volatile memory. However, such an embedded memory is becoming the big macro in a SoC and more and more difficult to be managed when the lithography node is below 28 nm in particular for improving their size to more than 128 MBit.

The present disclosure suggests improving the memory size by providing a structurally independent memory component 1 coupled to the host device 10 or to the System-on-Chip. The memory component 1 is structured as a stand-alone device realized in a single die with a technology specifically dedicated to the manufacturing of flash memory devices. The size of this memory portion is enlarged up to more than 256 Mbit or even 512 Mbit.

This non-volatile memory component 1 includes an array 90 of Flash memory cells and a circuitry located around the memory array and closer to a plurality of peripheral pads, as will be disclosed later. This memory component 1 has a variable size according to the size of its memory array that is manufactured according to the user's needs in a range of values from 128 Mbit to 512 Mbit or more.

More particularly, the Flash memory component 1 includes an I/O circuit 5, a micro-sequencer 3 and sense amplifiers 9.

The Flash memory component 1 further includes a command user interface CUI 4, voltage and current reference generators 7, a charge pump architecture 2 and decoding circuitry 8 located at the array periphery.

To read the memory cells of the Array 90 it is provided a dedicated circuit portion including an optimized Read Finite State Machine that is used to ensure high read performance, such as: branch prediction, fetch/pre-fetch, interrupt management, error correction and so on.

To write and erase the memory cells of the Array 90 it is provided a dedicated logic circuit portion including a simplified Reduced Instruction Set Computer (RISC) controller or a Modify Finite State Machine or that is the logic circuit for handling the programming and erasing algorithms.

The memory component 1 is associated and linked to the host device 10 or to the SoC structure partially overlapping such a structure while the corresponding semiconductor area of the SoC structure is used for other logic circuits and for providing support for the overlapping structurally independent memory portion 1.

The coupling between the SoC structure 10 and the memory component 1 is realized interconnecting a plurality of respective pads or pin terminals that are faced one toward the other in a circuit layout that keeps the alignment of the pads even if the size of the memory component 1 should be modified.

For completeness sake it should be remarked that the memory component 1 may be coupled to the SoC or host structure 10 with a Flip Chip technology or other coupling techniques. The Flip Chip technology is also known with its abbreviation C4 (Controlled Collapse Chip Connection) and is a method for interconnecting semiconductor devices, such as IC chips and/or microelectromechanical systems (MEMS), to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), the chip is flipped over so that its top side faces down, and aligned pads-to-pads so that its pads are aligned with matching pads on the external circuit. Then the solder is reflowed to complete the interconnections.

In one embodiment of the present disclosure the disposition of the pads of the memory component 1 has been realized on a surface of the memory component 1. More specifically, the pads are realized over the array so that when the memory component 1 is reversed its pads are faced to corresponding pads of the SoC structure 10. Even a memory component of a larger size may be supported and interconnected with the pads of the SoC structure 10 just keeping the position and dislocation of the its interconnecting pads.

In one embodiment of the present disclosure the charge pump architecture 2 has been specifically provided for a memory component 1 strictly associated to the host or SoC structure 10 and including a JTAG logic structure.

This Flash memory component 1 uses the interconnection pads of the array and logic circuit portion to allow the interconnection with the host device or the SoC structure 10.

For instance, the final configuration can be a face-to-face interconnection SoC/Flash Array with sense amplifiers connected to the SoC in a Direct Memory Access type of memory configuration as well as with a JTAG logic structure and control pins for testing and other purposes.

Figure 3:
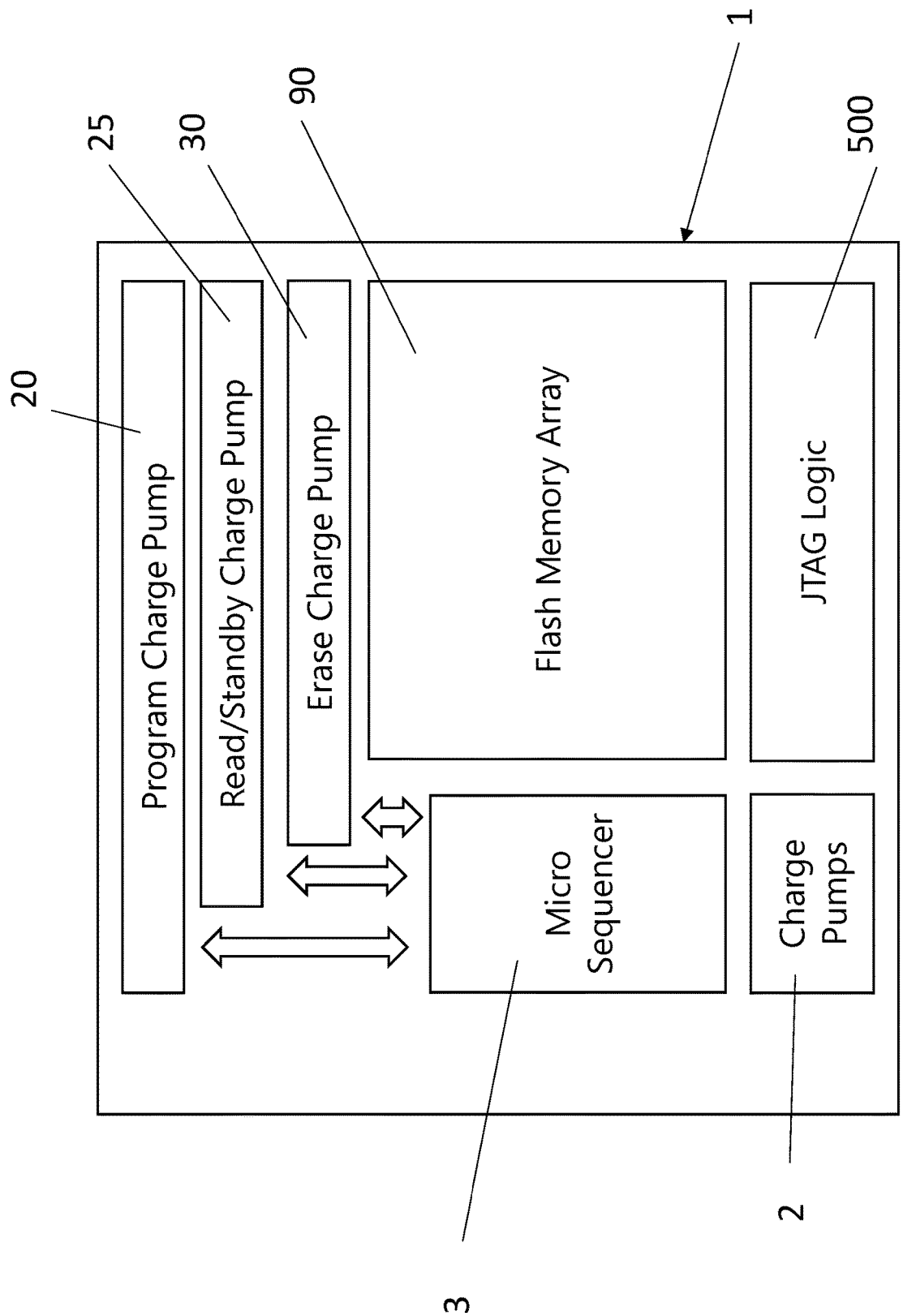
FIG. 3 is a schematic view of a memory component of the present disclosure as associated with the host device or a SoC structure and including at least a micro-sequencer and dedicated circuits for the programming, reading and erasing phases involving charge pumps.

FIG. 3 shows a more detailed schematic view of the Flash memory component 1 of the present disclosure comprising: the memory array 90, the micro sequencer 3, a control and JTAG logic structure 500 and circuit portions 20, 25 and 30 for managing the charge pumps during the programming, reading and erasing phases respectively.

Figure 4:
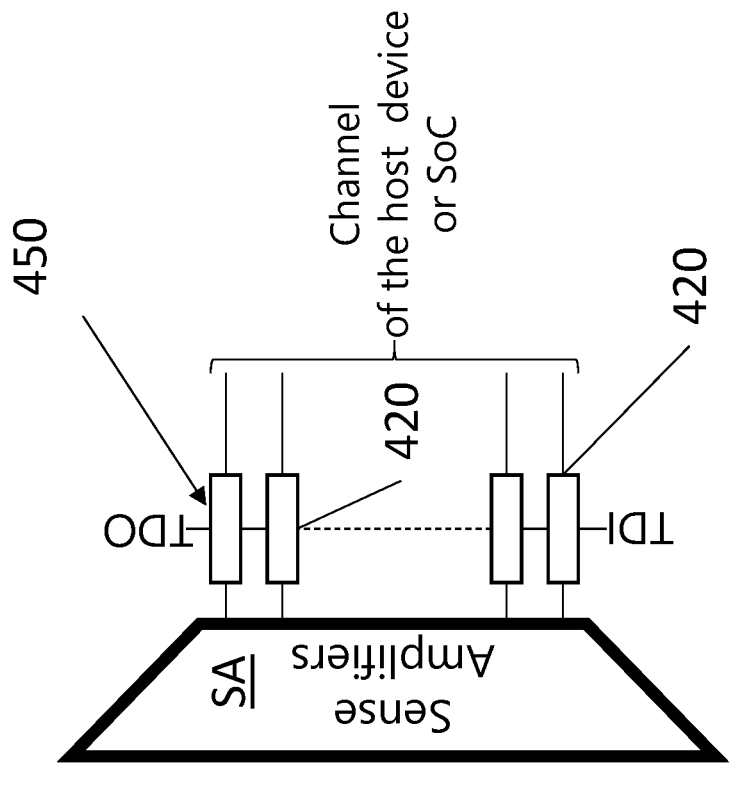
FIG. 4 is a schematic view of the internal layout of a portion of the memory component of FIG. 3 according to one embodiment of the present disclosure.

In embodiments of the present disclosure the memory array is built as a collection of sub arrays 400, as shown in the schematic view of FIG. 4. In this manner, having smaller sectors if compared to known solutions the access time is significantly reduced and the whole throughput of the memory component is improved.

The scan chains of each sub array 400 are connected together to form a unique shift register 450 to proper test the above-mentioned interconnections.

The advantage of this architecture is that it is very scalable and expanding and/or reducing the density of the final device translated only in mirroring a sub-array and generating the connection.

A Direct Memory Access allows to reduce the final latency that the SoC can experience when reading the data.

In the following of the present disclosure it will be apparent that the outputs of the sense amplifiers SA associated to each sub array 400 are latched by an internal circuit, so to allow to the sense amplifiers to execute a further internal read operation to prepare the second nibble or group of at least 128 Bits. This second nibble is transferred to the output of the flash array, using the clock signal or an additional enabling signal that transfers the content read at sense amplifier level to the channel of the host device or the SoC.

Each of the sense amplifiers SA is connected directly to a modified JTAG cell 420, so to integrate these modified Jtag cells and the sense amplifiers in a single output circuit portion. This allows reducing as much as possible the delay in propagating the output of the memory array to the SoC.

FIG. 4 shows a schematic view of a JTAG logic structure 500 incorporated into the memory component 1 of the present disclosure and using boundary-scan cells configured according to the IEEE standard No. 1149.1.

A JTAG logic structure is a special interface added to a chip. Depending on the version of JTAG, two, four, or five pins are added.

The connector pins are: TDI (Test Data In); TDO (Test Data Out); TCK (Test Clock); TMS (Test Mode Select) and an optional TRST (Test Reset).

The TRST pin is an optional active-low reset to the test logic, usually asynchronous, but sometimes synchronous, depending on the chip. If the pin is not available, the test logic can be reset by switching to the reset state synchronously, using TCK and TMS. Note that resetting test logic doesn't necessarily imply resetting anything else. There are generally some processor-specific JTAG operations which can reset all or part of the chip being debugged.

Since only one data line is available, the protocol is serial. The clock input is at the TCK pin. One bit of data is transferred in from TDI, and out to TDO at each TCK rising clock edge. Different instructions can be loaded. Instructions for typical ICs might read the chip ID, sample input pins, drive (or float) output pins, manipulate chip functions, or bypass (pipe TDI to TDO to logically shorten chains of multiple chips).

As with any clocked signal, data presented to TDI must be valid for some chip-specific Setup time before and Hold time after the relevant (here, rising) clock edge. TDO data is valid for some chip-specific time after the falling edge of TCK.

Figure 5:
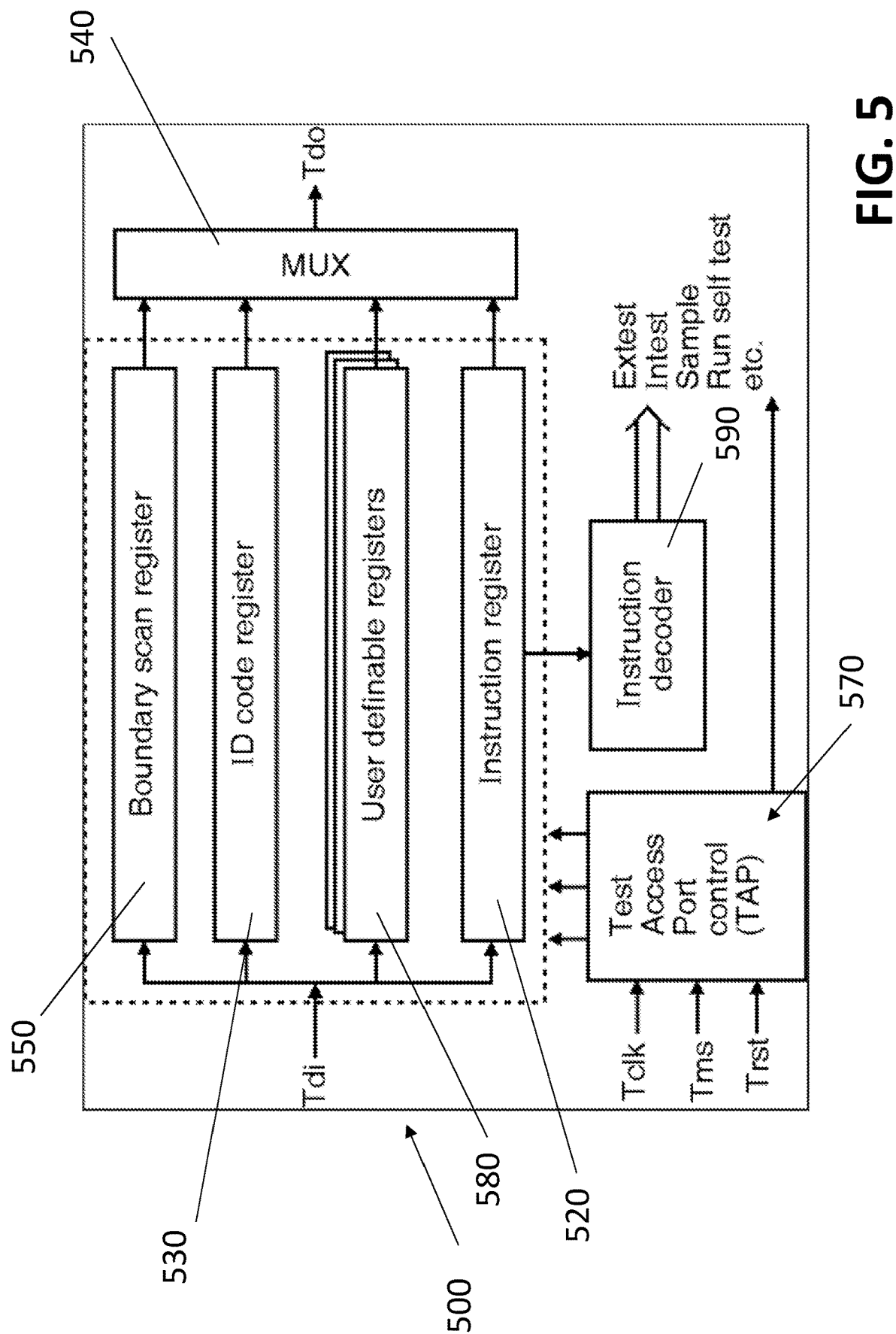
FIG. 5 is a schematic view of a JTAG logic structure incorporated into the memory component of the present disclosure.

The example of FIGS. 4 and 5 shows a set of four dedicated test pins—Test Data In (TDI), Test Mode Select (TMS), Test Clock (TCK), Test Data Out (TDO)—and one optional test pin Test Reset (TRST).

These pins are collectively referred as a Test Access Port (TAP). However, the architecture 500 includes a finite-state machine, named TAP controller 570, with receives as inputs three signals: TCK, TMS, and TRST. The TAP controller 570 is a 16-state final state machine FSM that controls each step of the operations of the JTAG logic structure 500. Each instruction to be carried out is stored in the Instruction Register 520.

FIG. 5 shows the composition of the registers incorporated into the JTAG logic structure 500 of the present disclosure. A boundary-scan shift register 550 is coupled to the TDI pin in serial mode and provides an output toward the TDO output pin via the multiplexer 560.

The test clock, TCK, is fed in via yet another dedicated device input pin and the mode of operation is controlled by a dedicated "Test Mode Select" (TMS) serial control signal both applied to the TAP controller 570.

The various control signals associated with the instruction are then provided by a decoder 590.

The Instruction Register (IR) 520 includes n-bit (with n≥2) and is implemented for holding each current instruction. The architecture includes a 1-bit bypass register (not shown in FIG. 4) and the Identification Register 530.

An additional register 580 is used as shift data register for allowing the interaction with the core of the host device in the writing and/or reading phases of the memory component.

Now, the command user interface represented by the TAP controller 570 is based on the IEEE1149 and IEEE1532 standards, that implement a low signal count interface, i.e. TMS, TCK, TDI, TDO, TRST (Optional) with capability to modify the internal content of each of the associated memory sub array 400.

Figure 6:
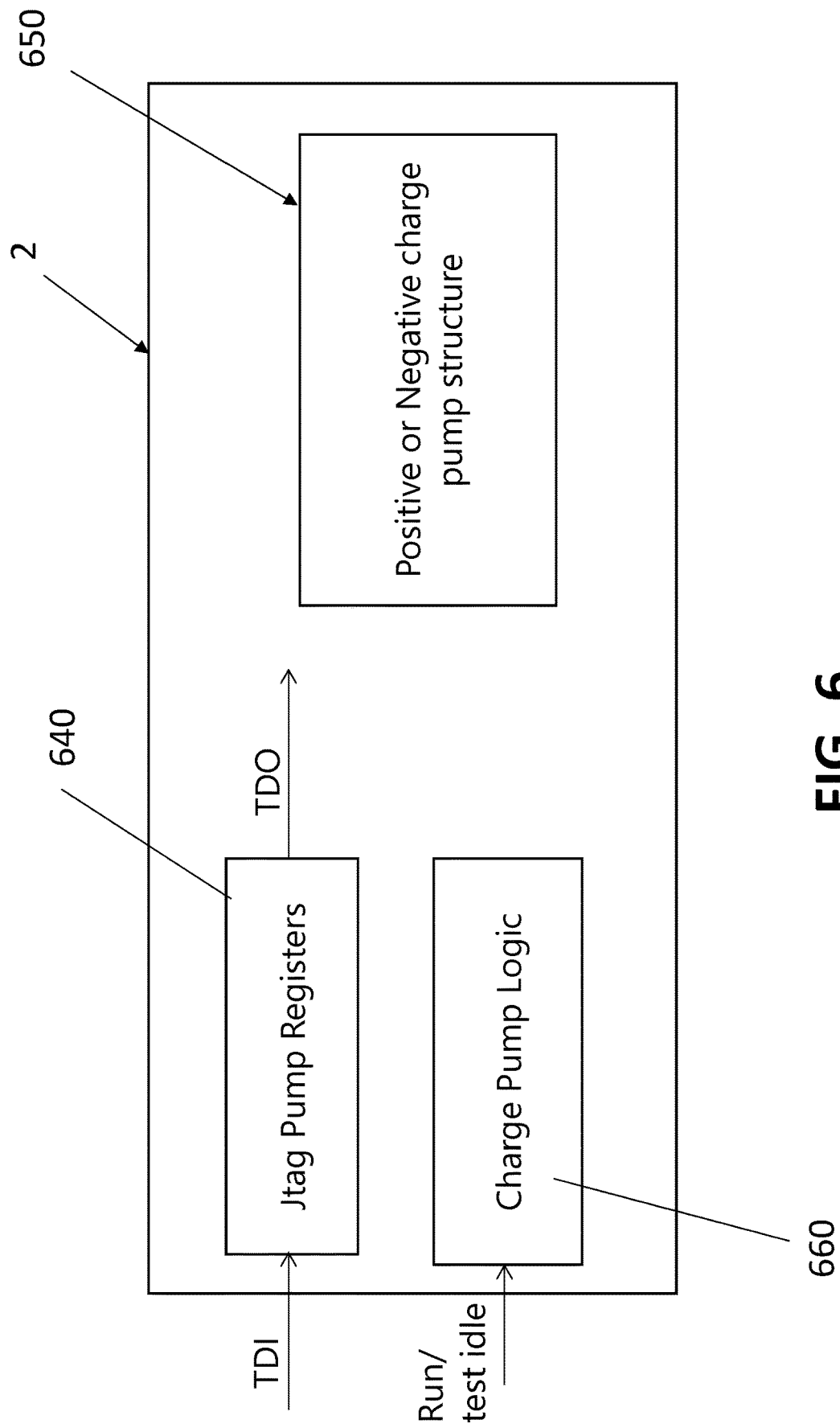
FIG. 6 is a schematic view of the intelligent charge pump architecture for the memory component of the present disclosure.

In one embodiment of the present disclosure, as shown in FIG. 6, it is provided the charge pump architecture 2 with at least a registers block 640 and a simple charge pump logic circuit 660 to associate to the flash memory array 90, thus obtaining an intelligent charge pump architecture 2.

This kind of intelligent charge pump architecture 2 is associated to each sub-array 400 of the flash memory array 90.

This intelligent charge pump architecture 2 can be used with great profit for the flash array testing phase. It provides all the voltage needed without any external support (i.e. testing machine, external generators)

However, the charge pump of the present disclosure is also fully usable for other different purposes and it can also be shared among sub-arrays 400 of the memory array 90.

For fully understanding the differences between the present invention and the known solutions, it must be noted that in a stand-alone flash memory, making single operation at a time, the resident micro-sequencer drives the output voltage of the charge pumps to drive the proper operations inside the array.

On the contrary, according to embodiments of the present disclosure, shown for example in FIG. 3, the structure of the memory component 1 including the flash memory array 90 is associated with the micro-sequencer 3 exchanging signals with the circuit portions 20, 25 and 30 dedicated to the programming, reading and erasing phases involving the charge pump architecture 2 of the present disclosure.

A multi-operation flash memory array 90 like the memory array incorporated in the memory component 1 would have needed multiple independent charge pumps 2 to ensure the different execution in different blocks. On the contrary, the solution disclosed herewith provides for a pump architecture 2 capable to supply the required voltage for different phases in the operations on the memory array.

The need of having concurrent operation drives also a change in the method the charge pump architecture 2 operates, i.e. it needs an independent charge pump logic 660 to operate so to allow the unique micro-sequencer 3 to drive high performance operation in different sub arrays of the memory array 90.

The pumps 2 associated to each sub array 400 can be configured by using the micro sequencer 3 as explained hereinafter.

Figure 7A:
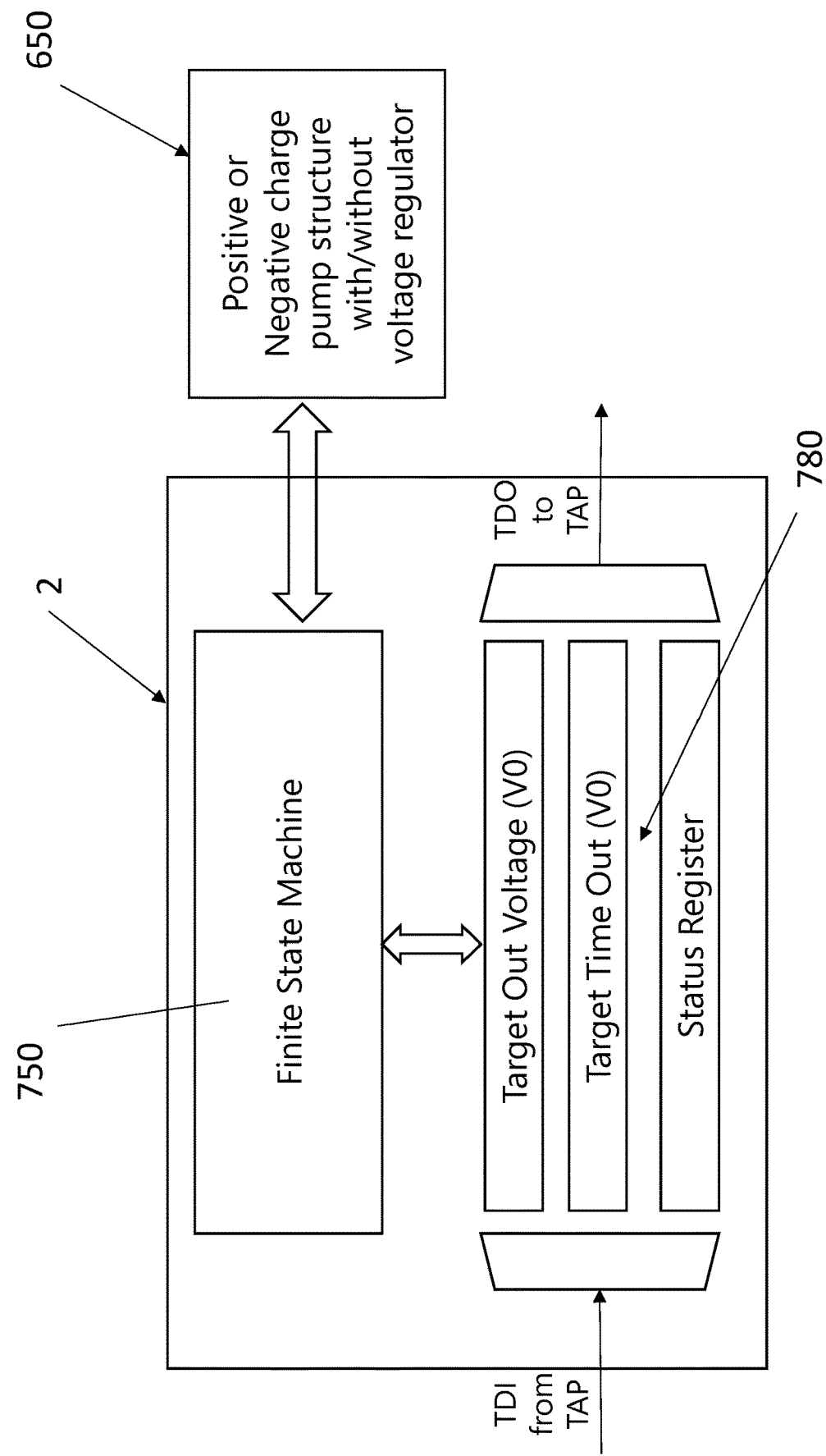
FIG. 7A is a more detailed schematic view of a portion of the charge pump architecture shown in FIG. 6.
Figure 7B:
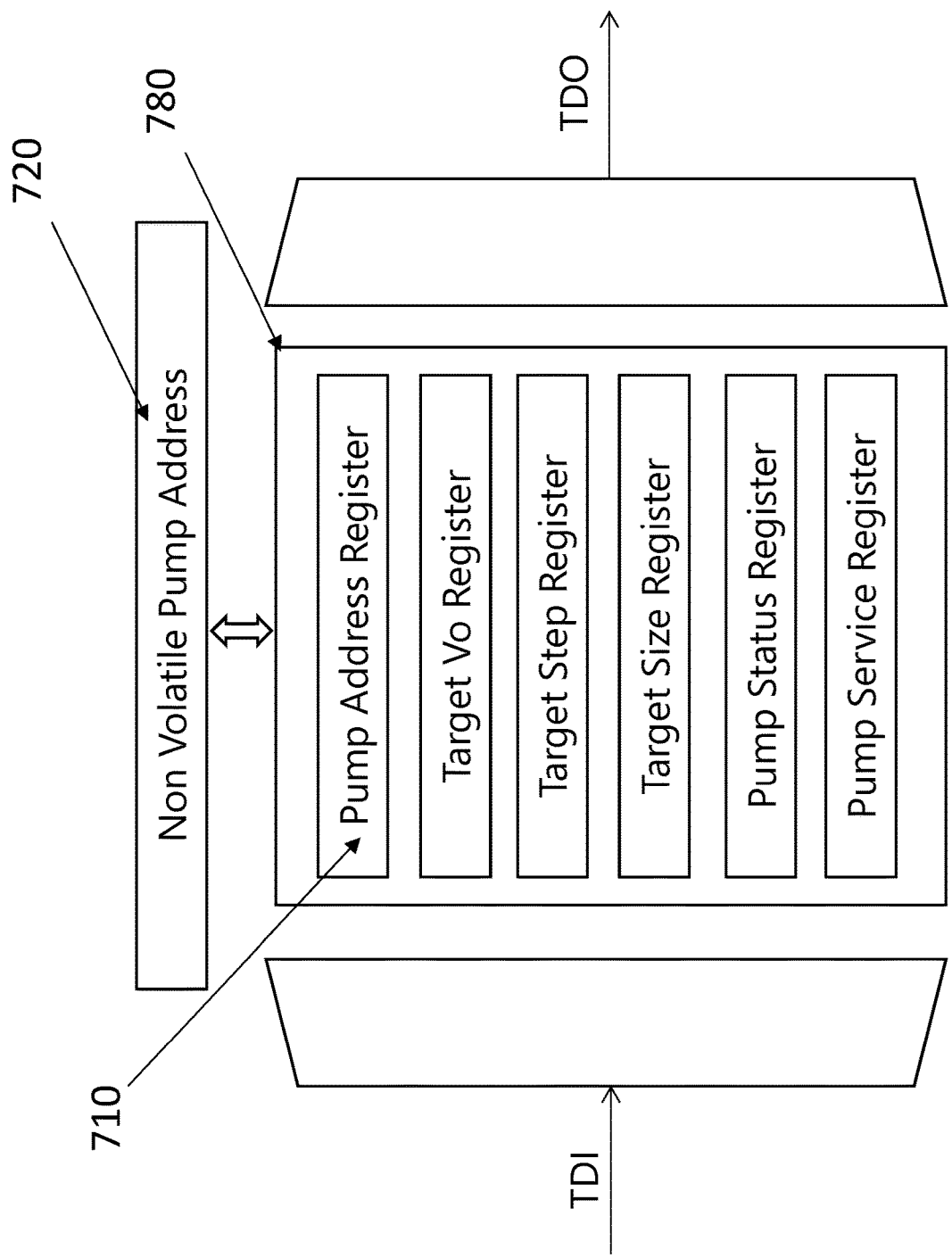
FIG. 7B is a more detailed schematic block view of the components of the charge pump architecture of the present disclosure.

A more detailed view of the registers of the block 780 is shown in FIG. 7B wherein it is reported also the presence of a register 710 for setting the specific pump for the specific memory sub-array or a register for the target steps for reaching the target output voltage.

A non-volatile pump address register 720 is used to assign at each pump in each sub-array a method to address it, that is to say: a code for being addressed. The pump address register 720 is a volatile copy of the pump address for the independency of the pump operations. An external FSM and/or RISC can provide inputs and start signals to this logic and then wait for the outcome.)

In FIGS. 6 and 7A it has been indicated with the number 650 a generic block that includes a positive or a negative pump chain for instance as that shown in FIG. 1A or 1B. This is because the memory array needs both positive and negative pumps in various operations performed the memory cells and it may happen that both positive and negative pumps must be activated at the same time.

Once configured, the pumps 2 (positive or negative) can be used simultaneously once a trigger (start or run signal) is asserted. This because some operation, like erase, need simultaneously a positive (flash cells source/body terminals) and a negative (flash cells gate terminals) voltage.

There exists also a signal (pump_halt) that permit to suspend the voltage evolution, when asserted, and to restart once that signal is de-asserted (this permit to support some feature like the erase suspend.

For a better understanding of all the features of the charge pump architecture 2 it is suitable to explain how the logic circuit portion 660 is fed and how registers block 640 may be considered a JTAG pump registers block.

As it is known in this technical field, a JTAG (Joint Test Action Group) standard protocol provides a method for testing interconnections on printed circuit board that is implemented at the IC level making use of a serial shift register located around the boundary of a device.

The IEEE standard No. 1149.1 is usually referred to as the digital boundary scan and provides a means to test interconnections between integrated circuits on a board without using physical test probes since it teaches adding a boundary-scan cell that includes a multiplexer and latches, to each pin on the device. Moreover, the other standard IEEE1532, adopted in System Programming allows to use the JTAG infrastructure to change the internal configuration of components in a programmable and non-programmable manner.

Figure 8:
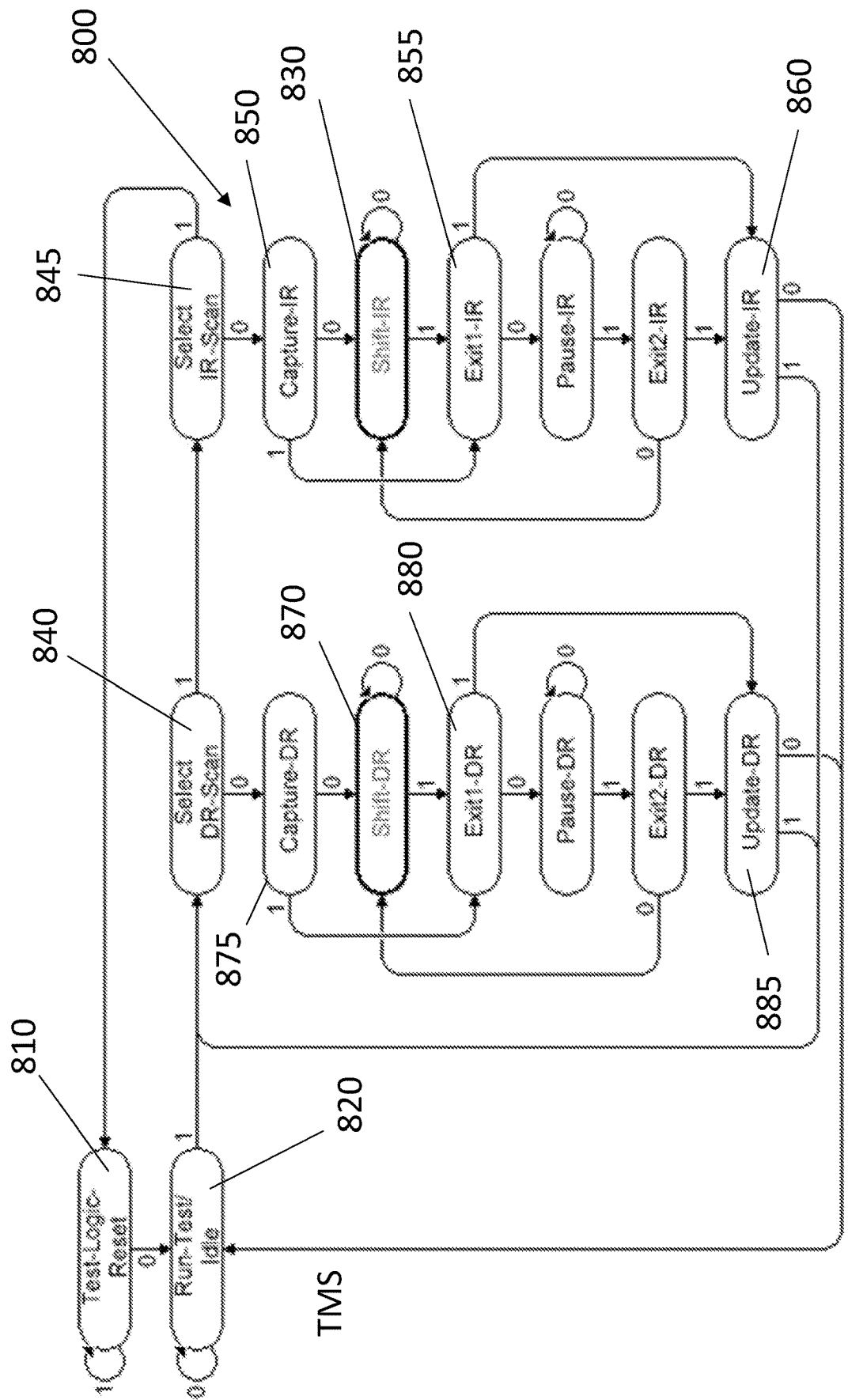
FIG. 8 is a diagram showing a Finite State Machine evolving though a plurality of states according to a JTAG standard protocol.

FIG. 8 shows a diagram of the states of finite state machine FSM operating according to the standard IEEE1149.1. This FSM includes sixteen states, and two of them, i.e. shift instruction register (ShiftIR) and shift data register (ShiftDR), allows the interaction with the memory array in the writing and/or reading phases. There are six "stable states" where keeping TMS stable prevents the state from changing. In all other states, TCK always changes that state.

FIG. 8 shows schematically the Test Access Port TAP 800 as a Finite State Machine taking care of all the operations concerning the testing of an integrated circuit such as a memory device.

The sequence of logic signals "0" and "1" applied to the TMS pin controls the operation of the chip architecture through the boundary scan structure.

Let's first consider to start from the test logic reset state indicated with the number 810 when the circuit is powered up. In this specific state all the boundary scan cells are in a so-called transparent condition with the parallel input PIN connected internally to the parallel output POUT and all the input pins are connected to the core of the integrated circuit.

By driving an appropriate sequence of logic values "1" and "0" as TMS signal it is possible to set the output multiplexer in such a manner that the TDI input is shifted as the first instruction to obtain the output TDO. The signal TMS drives the TAP FSM in ShiftDr or ShiftIr to connect the TDI and the TDO to a register.

To shift an instruction we need to go to the state ShiftIR with number 830 and to reach that state we need to apply the following sequence: setting 0 as TMS and driving one clock pulse to TCK we reach the Run/Idle state 820.

Selecting now a "1" from the state 820 we pass to a selection of a Data Register scan 840 and to an Instruction Register scan 845. With a further "0" on the TMS we can reach the Capture phase of the Instruction Register 850.

The capture phase allows catching to two final Bits of the Instruction Register 520 in FIG. 7A. Capture means using the parallel input to capture in each cell of the selected register the value.

A further "0" drives to the Shift IR that allows to pass the input value TDI to the output TDI. The TDI value at the input appears on the output TDO after a number of clocks equal to the size of the register.

Keeping the TMS to "0" we may remain in the Shift IR state 830 allowing to shift the bits received on the TDI pin to the output TDO.

It is possible to remain in that state 830 for all the clock cycle needed to shift all the input bits.

We remain in the ShiftIR state 830 for a number of clock cycle corresponding to the number of bits of the IR 720 minus one. At the end of the sequence the Exit-1 IR state 855 is reached.

From this exit state 855 we will move to an update state 860 driving a "1" TMS and this is the moment when the new instruction become valid. The boundary scan cells are reverted to test mode wherein the input pins are isolated from the core circuitry.

It is now possible to send the test vector to the core circuitry by reaching the Shift DR state 870.

The states of the Data Register are similar to the states of the Instruction Registers.

Therefore, with the sequence 1-0-0 we can reach the ShiftDR state 870.

Passing through the Capture DR 875 the first multiplexer MO1 of the boundary scan cell is connected to the parallel input PIN and all the input pins of the boundary scan register have captured their input value.

Going now to the Shift DR 870 the multiplexer changes its state allowing to catch the serial input SIN and the scan path is shifted from the TDI input through the boundary scan register to the output pin TDO.

The circuit remains in this state for a number of clock cycle corresponding to the number of boundary scan cells minus one. However, the boundary scan is one of the possible data register, selected with a proper instruction in the IR register.

The new test vector comes out to the output pins when the Exit-1 DR 880 state is passed and the Update DR state 885 is reached.

The sequence is repeated going from update to capture to allow a new test vector to be introduced into the circuitry.

An example of flow to address a specific charge pump architecture 2 has been shown schematically in FIG. 8 as an example of FSM evolving in different states and can be the following:
ShiftIR: Pump_Address_Instruction
ShiftDR: Pump_address_shift_in to select the desired pump
ShiftIR: Vo_Target_Instruction
This final instruction is loaded only in the selected pump.
An alternative example of flow of instructions to address a specific charge pump architecture 1 can be the following:
ShiftDR: Vo_target_value shift in
ShiftIR: Vo_Target_Step_Instruction
This final instruction is loaded only in the selected pump.
A further example of flow of instructions to address a specific charge pump architecture 2 can be the following:
ShiftDR: Vo_Target_Step_value shift in
ShiftIR: Vo_Target_Size_Instruction
This final instruction is loaded only in the selected pump.
A further example of flow of instructions to address a specific charge pump architecture 1 can be the following:
ShiftDR: Vo_Target_Size_value shift in ShiftIR: Pump_Service_Instruction This final instruction is loaded only in the selected pump.

Another example of flow of instructions to address a specific charge pump architecture 2 can be the following:
ShiftDR: Vo_Service_value shift In This instruction can give additional info to the charge pump, i.e. standby info, test modes inputs, etc.

Still another example of flow of instructions to address a specific charge pump architecture 1 can be the following:
Run/Test_Idle It starts the execution of the pump and/or for the selected pumps forces a service register bit that can determine if the pump has to run when the run/test_idle bit is set.

As we have seen, the TAP includes test data input and test data output and a clock signal. More particularly, the shift data register ShiftDR reports a state where the TDI is connected with a register. In that state the register content is transferred in and/or out of the device.

Similarly, the shift instruction register ShiftIR also reports a state where the TDI is connected with a register. Instruction are loaded in that state.

More particularly, the shift data register ShiftDR reports a state where the signal TDI is connected with a register. In that state the register content is transferred in and/or out of the device.

Similarly, the shift instruction register ShiftIR also reports a state where the TDI is connected with a register. Instruction are loaded in that state.

Due to the requirement of having multiple core inside the host device 10 or the SoC, the internal register 580 of the JTAG interface must be able to support up to address and data registers. In particular, the generation of four address registers (one from each sub-array 400) is provided to be filled with a different address for each sub array 400 and triggering four different data out for the read register [0:3], per sub-array section. The communication to the SoC happens connecting the selected Read Register, i.e. the output named POU [127:0], directly to input of the channel of the host device or SoC 10.

This mechanism allows to pre-load the data for the controller, reducing the latency time to a very low value.

For completeness sake, it should be noted that the JTAG state machine can reset, access an instruction register, or access data selected by the instruction register.

To use JTAG, a host device is connected to the target's JTAG signals (TMS, TCK, TDI, TDO, etc.) through some kind of JTAG adapter, which may need to handle issues like level shifting and galvanic isolation. The adapter connects to the host using some interface such as USB, PCI, Ethernet, and so forth The host device 10 communicates with the TAP block 570 by manipulating TMS and TDI in conjunction with TCK, and reading results through TDO (which is the only standard host-side input). TMS/TDI/TCK output transitions create the basic JTAG communication primitive on which higher layer protocols build:

State switch: wherein all TAPs signals are in the same state, and that state changes on TCK transitions.

So at a basic level, using JTAG involves reading and writing instructions and their associated data registers; and sometimes involves running a number of test cycles. Behind those registers is hardware that is not specified by JTAG, and which has its own states that is affected by JTAG activities.

Each primary input signal and primary output signal is supplemented with this multi-purpose memory element called a boundary-scan cell that is substantially the shift register 550.

A parallel load operation, called a "capture" operation, causes signal values on device input pins to be loaded into input cells and signal values passing from the core logic to device output pins to be loaded into output cells.

A parallel unload operation—called an "update" operation—causes signal values already present in the output scan cells to be passed out through the device output pins. Depending on the nature of the input scan cells, signal values already present in the input scan cells will be passed into the core logic. The update operation allows also to confirm the values in the register (i.e. the shift introduces the bits, that can be paused), when the update state is reached in the IEEE1149.1 FSM, the register value is fixed, i.e. it is a sort of latching signal to update the value of the targeted registers Data can also be shifted around the shift register in serial mode, starting from a dedicated device input pin called "Test Data In" (TDI) and terminating at a dedicated device output pin called "Test Data Out" (TDO).

So, there is an edge-connector input called TDI connected to the TDI of the first device. TDO from the first device is connected to TDI of a second device, and so on, creating a global scan path terminating at the edge connector output called TDO.

The test clock, TCK, is fed in via yet another dedicated device input pin and the mode of operation is controlled by a dedicated "Test Mode Select" (TMS) serial control signal.

In one embodiment of the present disclosure the TDI and TDO signals are used to drive the registers block 640 of the charge pump architecture 2 shown in FIG. 6.

The present disclosure provides several hardware modifications if compared to the configuration of the charge pumps of a stand-alone flash memory device, in particular:
- the conversion of the charge pump into an intelligent sub-system with the provision of the registers block 640 and logic circuit portion 660;
- the generation of the proper output voltage with a proper shape, i.e. stair case amplitude and size as a Vo output value of the pump chain portion 650; with a modest delay in the generation of the steps;
- the integration with a JTAG protocol;
- the assignment of a programmable address to the charge pump architecture 2 for allowing to identify the different pumps of each different sub-array 400 of the flash memory array 90;
- the provision in the registers block 640 of at least a couple of registers interconnected using the TDI/TDO logic:
    - an address register to drive the specific pump of a specific sub-array;
    - an amplitude of the stair case register to define how great is the stepping of the Vo value.

One embodiment of the present disclosure relates to a charge pump architecture for memory devices structured in a plurality of sub-arrays, the architecture including:

a chain of stages for increasing the value of an input voltage and obtaining an overvoltage output value;

at least a register block 640 coupled to said chain of stages 650 and driven by a logic circuit portion 660 for receiving at least an activation signal selecting a specific charge pump architecture associated to a memory sub-array.

The register block 640 includes at least a couple of registers: one for activating the specific charge pump architecture 2 associated to a memory sub-array 400 and the other for defining the value of the pump output voltage Moreover, the register block 640 includes a JTAG finite state machine, shown in FIG. 7A with the number 750.

The logic circuit portion 660 selects and activates the corresponding pump chain 650 of each sub-array 400 of the memory array 90 passing through the registers block 640 to select not only the pump but also its activity. So, if the pump architecture is asked to provide a proper overvoltage value for the reading phase, then the logic circuit portion 660 will select the pumps of the sub-arrays involved in the reading phase.

Similarly, if the pump architecture is asked to provide a proper overvoltage value for the writing phase, then the logic circuit portion 660 will select the overvoltage values and the number and position of the pumps of the sub-arrays 400 involved in the writing phase.

Again, if the pump architecture 2 is asked to provide a proper overvoltage value for the erasing phase, then the logic circuit portion 660 will select the overvoltage values and the number and position of the pumps of the sub-arrays involved in the erasing phase.

As an alternative, the above mentioned address register is a lock-up table provided to record the quality and position of the pumps that are asked to take care of specific operating activities on the flash memory array 90; so there will be pumps for the reading or erasing phases and pumps for the writing phase and logic circuit portion 660 will select and activates the corresponding pumps just selecting a logic value.

It should be also considered that during an erasing phase no reading phase is performed and therefore there is no need of a specific pump architecture for reading and erasing while the multi-purpose structure of the charge pump architecture 1 is used for both the reading and erasing phases, obviously driven in an appropriate manner to obtain the required overvoltage values for the specific operation on the corresponding memory sub-array.

More specifically, the erase operation is done in (3) macro steps:
1) Pre-programming phase: it programs all the cells of the selected block;
2) Erase pulse;
3) Verification, using a read operation with marginal reference voltages to ensure the reliability;

The loop (2) and (3) is repeated till the block is erased or till a pre-defined timeout is reached. If the time out is reached, the result of the erase is a fail The pump architecture 1 is activated while the controller of the memory array takes care of other activities, for instance the preparation of the circuit portions dedicated to the reading and/or writing phases. The pump architecture 1 will thus reach the requires overvoltage values during the time frame wherein the controller is busy for the other activities.

Further features of the circuit structure associated to the charge pump of the present disclosure are disclosed hereinafter with reference for instance to FIG. 7A wherein it is schematically shown the basic internal structure of the registers block 580.

A finite state machine 750 is bidirectionally connected to the pump chain 650 to apply the proper value of the input reference voltage Vin and the modulation of the phases and to regulate the proper value at the output, Vout.

Even this state machine 750 may be considered a JTAG state machine. However, the pump FSM 750 interfaces with the JTAG FSM previously disclosed, but it works in a different manner as a sort of step-by-step logic to regulate and maintain using comparisons.

The finite state machine 750 is also bidirectionally connected with a group of registers 780 each including a target value that the charge pump architecture 2 shall achieve, for instance: the target output voltage, the target time within which the output voltage shall reach its value and the status of some other registers.

With reference to the more detailed view of the registers of the block 780 shown in FIG. 7B, as already indicated the register 710 is used for setting the specific pump for the specific memory sub-array or a register for the target steps for reaching the target output voltage, the non-volatile pump address register 720 is used to assign at each pump in each sub-array a method to address it, that is to say: a code for being addressed and the pump address register 720 is a volatile copy of the pump address for the independency of the pump operations, external FSM and/or RISC providing inputs and start signals to this logic and then wait for the outcome.)

In any case, all the registers of the block 780 are selectable according to the values of the TDI input signal. More specifically, the content is loaded with the TDI signal, while the register is addressed driving the TMS signal to move in the JTAG finite state machine.

The logic circuit portion 660 is responsible to run the proper phases sequences to match the desired settings in the JTAG Pump Registers 780 and to report out the status. The logic circuit portion 660 is linked to the run/test idle state of the JTAG state machine.

The logic circuit portion 660 is also responsible to update the status either in the registers block 780 and, if it is needed, also with direct signals for the micro sequencer 3.

More particularly, the logic circuit portion 660 of the charge pump shall allow the following settings:
Size of the duration step to define how long a certain voltage must be maintained;
Target final voltage: that is to say the value of the Vo target voltage;
Dedicated hardware, in the sense of definition of the hardware portions involved by the charge pump architecture:
to start the operation, when the run/test idle is reached;
to provide feedback to the micro-sequencer;
to disable the pump in case of non-usage for minimizing the power consumption.

The charge pump architecture 2 of the present disclosure is driven by the internal micro sequencer 3, that is also the flash controller. The micro sequencer 3 properly configures the pumps blocks and then, once the pumps are triggered with the start (run) signal, they implement the Vout voltage shape requested, using a comparison with a proper reference and wait states to reach the final voltage because the pumps have internally one or more voltage regulator that need a reference voltage value as indicated in FIG. 7A with the possibility that pumps include regulators implementing a sort of D/A converter with high voltage values (positive or negative) involved.

The logic circuit portion 660 is further responsible to run the proper phases sequences to match the desired settings in the JTAG Pump Registers and to report out the status.

The Charge Pump Logic is linked to the run/test idle state of the JTAG state machine.

The charge pump logic is also responsible to update the status either in the register and, if it is needed, also with direct signals for the micro sequencer.

The proposed charge pump architecture of the present disclosure allows to address multi-operation in the different sub-arrays of the flash memory array 90.

Moreover, the new pump architecture allows using the JTAG protocol to drive the charge pump in different situations, such as:

for performance purpose;
for testing purpose;
for field failure analysis purposes.

The charge pump architecture of the present disclosure has the great advantage to provide a unique charge pump design and to reduce the time-to-validation and the time-to-design.

Moreover, it is a re-suable block, thanks to the intelligence and the registers.

Further advantages are given by the fully re-usability of the charge pump architecture that can be used for different purposes and can be shared between sub-arrays of the memory device.

The invention claimed is:

1. A memory device, comprising:
   a plurality of sub-arrays;
   a charge pump architecture, comprising:
   a number of pump stages for increasing a value of an input voltage and obtaining an overvoltage output value to be provided to a selected one or more of the plurality of sub-arrays; and
   a registers block comprising:
   a pump address register indicating an address of the selected one or more of the plurality of sub-arrays; and
   a number of registers storing values corresponding to respective target overvoltage characteristics, wherein the stored values correspond to a particular operation type to be performed on the selected one or more of the plurality of sub-arrays.

2. The memory device of claim 1, wherein the number of registers includes a register storing a value corresponding to a magnitude of the overvoltage output value.

3. The memory device of claim 1, wherein the number of registers includes a register storing a value corresponding to a time in which the overvoltage output value is to be reached.

4. The memory device of claim 1, wherein the number of registers includes a register storing a target voltage step value associated with reaching the overvoltage output value.

5. The memory device of claim 4, wherein the target voltage step value is a voltage step magnitude.

6. The memory device of claim 4, wherein the target voltage step value is a voltage step duration.

7. The memory device of claim 1, wherein the number of registers includes:
   a first register storing a value corresponding to a magnitude of the overvoltage output value; and
   a second register storing a target voltage step value associated with reaching the overvoltage output value; and
   a third register storing a value corresponding to a time in which the overvoltage output value is to be reached.

8. The memory device of claim 1, wherein the charge pump architecture further comprises a finite state machine to drive the registers block.

9. The memory device of claim 1, wherein the values stored in the registers of the registers block are programmable.

10. The memory device of claim 1, wherein the particular operation type includes a write operation, a read operation, and an erase operation.

11. A charge pump architecture, comprising:
    a chain of pump stages for increasing the value of an input voltage and obtaining an overvoltage output value;
    a registers block coupled to the chain of pump stages; and
    a non-volatile pump address register within the registers block that assigns each pump in each sub-array of a plurality of sub-arrays a code for being addressed.

12. The charge pump architecture of claim 11 wherein a register of the registers block includes a first register for activating the specific charge pump architecture associated with the memory sub-array and a second register for defining the value of the pump output voltage.

13. The charge pump architecture of claim 11 wherein the registers block include a JTAG finite state machine.

14. The charge pump architecture of claim 13 wherein a logic circuit portion is linked to the run/test idle state of the JTAG state machine.

15. The charge pump architecture of claim 14 wherein a register of the registers block is selected according to the values of a TDI input signal of the JTAG protocol with the content loaded by the TDI signal while the register is addressed driving a TMS signal to move in the JTAG finite state machine.

16. The charge pump architecture of claim 11 wherein a register of the registers block is used to associate a pump architecture to a specific memory sub-array for providing the overvoltage values for the reading and writing phases.

17. A method, comprising:
    increasing a value of an input voltage and obtaining an overvoltage output value to be provided to a selected memory sub-array of a plurality of sub-arrays, wherein the selected memory sub-array is associated with a charge pump architecture;
    indicating an address of the selected one or more of the plurality of sub-arrays; and
    storing values corresponding to respective target overvoltage characteristics, wherein the stored values correspond to a particular operation type to be performed on the selected one or more of the plurality of sub-arrays.

18. The method of claim 17, further comprising defining the overvoltage output value using a logic circuit portion of the charge pump architecture.

19. The method of claim 17, further comprising regulating the overvoltage output value with a JTAG finite state machine which is bidirectionally connected to the charge pump architecture.

20. The method of claim 17, further comprising performing a read, erase, or write operation on the selected memory sub-array.

* * * * *